(12) United States Patent
Naujok et al.

(10) Patent No.: US 8,013,364 B2
(45) Date of Patent: Sep. 6, 2011

(54) SEMICONDUCTOR DEVICES AND STRUCTURES THEREOF

(75) Inventors: Markus Naujok, Hopewell Junction, NY (US); Hermann Wendt, Poughkeepsie, NY (US); Alois Gutmann, Poughkeepsie, NY (US); Muhammed Shafi Pallachalil, Wappingers Falls, NY (US)

(73) Assignee: Infineon Technologies AG, Neubiberg (DE)

( * ) Notice: Subject to any disclaimer, the term of this patent is extended or adjusted under 35 U.S.C. 154(b) by 23 days.

(21) Appl. No.: 12/579,807

(22) Filed: Oct. 15, 2009

(65) Prior Publication Data

US 2010/0032841 A1  Feb. 11, 2010

Related U.S. Application Data

(62) Division of application No. 11/151,134, filed on Jun. 13, 2005, now Pat. No. 7,629,225.

(51) Int. Cl.
*H01L 23/52* (2006.01)

(52) U.S. Cl. ........ 257/211; 257/350; 257/354; 257/374; 257/510; 257/522; 257/E23.013; 257/E21.564; 257/E21.573; 257/E23.581; 257/E23.142

(58) Field of Classification Search .......... 257/211, 257/350, 354, 374, 510, 522, E23.013, E21.564, 257/E21.573, E21.581, E23.142
See application file for complete search history.

(56) References Cited

U.S. PATENT DOCUMENTS

| | | | |
|---|---|---|---|
| 5,461,003 A | 10/1995 | Havemann | |
| 5,750,415 A | 5/1998 | Gnade et al. | |
| 6,071,805 A | 6/2000 | Liu | |
| 6,130,151 A | 10/2000 | Lin et al. | |
| 6,150,232 A | 11/2000 | Chan et al. | |
| 6,165,890 A | 12/2000 | Kohl et al. | |
| 6,255,712 B1 | 7/2001 | Clevenger et al. | |
| 6,413,852 B1 | 7/2002 | Grill et al. | |
| 6,486,058 B1 | 11/2002 | Chun | |

(Continued)

FOREIGN PATENT DOCUMENTS

EP   0 603 104 A1   6/1994

(Continued)

OTHER PUBLICATIONS

Bhusari, D., et al., "Fabrication of Air-Channel Structures for Microfluidic, Microelectromechanical, and Microelectronic Applications," Journal of Microelectromechanical Systems, Sep. 2001, pp. 400-408, vol. 10, No. 3, IEEE, Los Alamitos, CA.

(Continued)

*Primary Examiner* — Michelle Estrada
(74) *Attorney, Agent, or Firm* — Slater & Matsil, L.L.P.

(57) ABSTRACT

A structure having air gaps between interconnects is disclosed. A first insulating material is deposited over a workpiece, and a second insulating material having a sacrificial portion is deposited over the first insulating material. Conductive lines are formed in the first and second insulating layers. The second insulating material is treated to remove the sacrificial portion, and at least a portion of the first insulating material is removed, forming air gaps between the conductive lines. The second insulating material is impermeable as deposited and permeable after treating it to remove the sacrificial portion. A first region of the workpiece may be masked during the treatment, so that the second insulating material becomes permeable in a second region of the workpiece yet remains impermeable in the first region, thus allowing the formation of the air gaps in the second region, but not the first region.

20 Claims, 5 Drawing Sheets

U.S. PATENT DOCUMENTS

| | | | |
|---|---|---|---|
| 6,693,355 | B1 | 2/2004 | Grove |
| 6,815,329 | B2 | 11/2004 | Babich et al. |
| 6,861,332 | B2 | 3/2005 | Park et al. |
| 6,903,461 | B2 | 6/2005 | Kloster et al. |
| 6,943,121 | B2 | 9/2005 | Leu et al. |
| 7,125,782 | B2 | 10/2006 | Knorr et al. |
| 7,332,406 | B2 | 2/2008 | Park et al. |
| 2004/0102031 | A1 | 5/2004 | Kloster et al. |
| 2004/0127001 | A1 | 7/2004 | Colburn et al. |
| 2004/0137728 | A1 | 7/2004 | Gallagher et al. |
| 2004/0248400 | A1 | 12/2004 | Kim et al. |
| 2004/0259273 | A1 | 12/2004 | Kim et al. |
| 2005/0067673 | A1 | 3/2005 | Geffken et al. |
| 2005/0087875 | A1 | 4/2005 | Furukawa et al. |
| 2006/0081830 | A1* | 4/2006 | Knorr et al. ............ 257/3 |
| 2006/0119780 | A1 | 6/2006 | Baek et al. |

FOREIGN PATENT DOCUMENTS

| | | |
|---|---|---|
| JP | 04-207055 A | 7/1992 |
| JP | 2001-102453 | 4/2001 |
| JP | 2001-326153 | 11/2001 |
| JP | 2002-057084 | 2/2002 |
| JP | 2006-163346 | 6/2006 |

OTHER PUBLICATIONS

Gabric, Z., et al., "Air Gap Technology by Selective Ozone/TEOS Deposition," IITC 2004, Jul. 2004, pp. 151-153, IEEE.

Gosset, L.G., et al., "General Review of Issues and Perspectives for Advanced Copper Interconnections Using Air Gap as Ultra-low K Material," IITC 2003, Apr. 2003, pp. 65-67, IEEE.

"JSR—NGL Technology: Photoresists: Others," downloaded Jun. 10, 2005, 6 pages, JSR Micro, Inc., http://www.jsrmicro.com/pro__photo_otherNGL.html.

Loo, L.S., et al., "Chemical Vapor Deposition (CVD) and Characterization of Polymers and Polymeric Thin Films," 2003 Materials Research at MIT, downloaded Jun. 10, 2005, 4 pages, http://mpc-web.mit.edu/about_mpc/ar2003/gleason.pdf, Massachusetts Institute of Technology, Cambridge, MA.

Noguchi, J. et al., "Reliability of Air-Gap Cu Interconnect and Approach to Selective W Sealing using 90nm Node Technology," Jul. 2004, pp. 81-83, IEEE.

Noguchi, J., et al., "Simple Self-Aligned Air-Gap Interconnect Process with Cu/FSG Structure," IITC 2003, Apr. 2003, pp. 68-70, IEEE.

Saito, T., et al., "A Robust, Deep-Submicron Copper Interconnect Structure using Self-Aligned Metal Capping Method," IITC 2004, Jul. 2004, pp. 36-38, IEEE.

Sudijono, J., IEDM 2004—Short Course: 45nm BEOL, Dec. 2004, pp. 43-44.

Wolf, S., et al., "Silicon Processing for the VLSI Era," 2000, p. 128, vol. 1, Lattice Press, Sunset Beach, CA, USA.

Wolf, S., et al., "Silicon Processing for the VLSI Era," 2000, pp. 719-723, vol. 1, Lattice Press, Sunset Beach, CA, USA.

\* cited by examiner

SEMICONDUCTOR DEVICES AND STRUCTURES THEREOF

This is a divisional application of U.S. application Ser. No. 11/151,134, entitled, "Methods of Manufacturing Semiconductor Devices and Structures Thereof," which was filed on Jun. 13, 2005 now U.S. Pat. No. 7,629,225 and is incorporated herein by reference.

TECHNICAL FIELD

The present invention relates generally to the fabrication of semiconductor devices, and more particularly to the formation of insulating materials of interconnect layers.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices typically include several layers of insulating, conductive and semiconductive materials that are patterned to form integrated circuits (ICs). There may be a plurality of transistors, memory devices, switches, conductive lines, diodes, capacitors, logic circuits, and other electronic components formed on a single die or chip. Semiconductor technology has experienced a trend towards miniaturization, in order to meet the demands of product size reduction, improved device performance, and reduced power requirements in the end applications that semiconductors are used in, for example.

In the past, integrated circuits contained only a relatively small number of devices per chip, and the devices could be easily interconnected. However, in more recent integrated circuit designs, there may be millions of devices on a single chip, resulting in the need for multilevel interconnect systems, wherein the area for interconnect lines is shared among two or more material levels.

The manufacturing process for semiconductor devices is typically referred to in two phases: the front-end-of-line (FEOL) and the back-end-of-line (BEOL). The FEOL is defined as the process steps that begin with a starting wafer up to the formation of the first metallization layer, and the BEOL is defined as all process steps from that point forward. The interconnect lines of an integrated circuit are usually formed in the BEOL.

As the minimum line width on an integrated circuit becomes smaller, the active device density increases, and transistor switching speed decreases, while signal propagation delays in the interconnect system become limiting on the performance of the integrated circuit. Also, as the chip size increases, the interconnect path lengths also increase. Thus, many large ultra-large scale integration (ULSI) integrated circuits are limited by interconnect propagation delay time.

The propagation delay of integrated circuits becomes limited by the RC delay of the interconnection lines when the minimum feature size is decreased below about 0.25 µm for example, which limits the circuit speeds. The RC delay refers to the resistance of the conductive lines used for the interconnect and the capacitance between the conductive lines.

One challenge in the semiconductor industry is to reduce and minimize the RC delay of integrated circuits, in order to improve device performance and increase device speed. The resistive or R component of RC delay is being addressed by the move from the use of aluminum to copper, which has a lower resistance than aluminum, as the material of conductive lines. The C or capacitive component of RC delay is being addressed by attempts to use insulating materials between the conductive lines that comprise a lower dielectric constant (k) than materials such as $SiO_2$ that were used in the past for inter-metal dielectric (IMD) materials.

What are needed in the art are improved methods of lowering the capacitive component C of the RC delay in integrated circuits.

SUMMARY OF THE INVENTION

These and other problems are generally solved or circumvented, and technical advantages are generally achieved, by preferred embodiments of the present invention, which provide novel methods of forming air gaps between conductive lines of semiconductor devices and structures thereof.

In accordance with a preferred embodiment of the present invention, a method of manufacturing a semiconductor device includes providing a workpiece, forming a plurality of conductive lines over the workpiece, disposing a first insulating material over the workpiece, and disposing a second insulating material over the first insulating material. The first insulating material is disposed between the plurality of conductive lines. The second insulating material is disposed between the plurality of conductive lines and comprises a sacrificial portion. The second insulating material is treated to remove the sacrificial portion of the second insulating material, and at least a portion of the first insulating material is removed, forming air gaps between the plurality of conductive lines.

In accordance with another preferred embodiment of the present invention, a method of manufacturing a semiconductor device includes providing a workpiece, disposing a first insulating material over the workpiece, and disposing a second insulating material over the first insulating material. The second insulating material has a top surface and comprises a sacrificial portion. The second insulating material and the first insulating material are patterned, and a conductive material is disposed over the patterned second insulating material and the first insulating material. The conductive material is removed from over the top surface of the second insulating material, leaving conductive material within the patterned first and second insulating material. The second insulating material is treated to remove the sacrificial portion of the second insulating material, and at least a portion of the first insulating material is removed.

In accordance with yet another preferred embodiment of the present invention, a semiconductor device includes a workpiece, the workpiece comprising a first region and a second region, and a plurality of conductive lines formed over the workpiece, the plurality of first conductive lines having a top region. A first insulating material is disposed between the plurality of first conductive lines proximate the top region of the plurality of first conductive lines, the first insulating material being impermeable in the first region and permeable in the second region. A second insulating material is disposed beneath the first insulating material between the plurality of first conductive lines in the first region. Air gaps are disposed beneath the first insulating material between the plurality of first conductive lines in the second region.

Advantages of preferred embodiment of the present invention include providing novel methods of forming air gaps between conductive features. Air gaps having a predictable shape over a wide range of spaces between conductive lines are created. No additional topography is introduced to the semiconductor device, and few additional processing steps are required. In one embodiment, air gaps are formed between conductive features in critical areas, but not in non-critical areas, where the RC delay is not an issue. Because some regions of the workpiece do not have the air gaps disposed therein, the insulating material in those regions provides strong structural support and mechanical strength for the integrated circuit. The top layer of insulating material having the sacrificial portion is impermeable as deposited, preventing contamination of the various material layers during the chemical-mechanical polish procedure to remove excess conductive material from the top surface of the top layer of insulating material.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The capacitance C in the RC delay of BEOL interconnects may be lowered by the use of low-k materials. For example, silicon dioxide ($SiO_2$), commonly used as an interconnect insulating material in the past, has a dielectric constant k of about 4.1 or 4.2. A dense low-k material may have a k value of about 2.8, for example, whereas a porous low-k material may have a k value of about 2.2, for example. However, lowering the dielectric constant to a value lower than about 2.2 is difficult, because the porosity of the insulating materials becomes larger as the dielectric constant decreases; thus, the low k insulating material becomes weaker.

Theoretically, air is an ideal dielectric, having a dielectric constant of 1.0. However, a problem with using air as an insulating material between conductive lines is that the structure can easily collapse under mechanical stress, e.g., during further manufacturing processing, testing, packaging, or transportation, destroying the integrated circuit. An interconnect system needs to be workable, reliable, and mechanically stable, so that the chip can be manufactured and packaged, for example.

Thus, integration schemes for introducing air between conductive lines without collapsing the interconnect structure, and for manufacturing an interconnect system having air gaps between conductive lines that does not easily collapse, are needed in the art.

Prior art methods of forming air gaps include forming air gaps in copper/low dielectric constant integration schemes using sacrificial films or template films, as described by John Sudijono in a presentation at IEDM 2004—Short Course entitled, "45 nm BEOL," p. 43, which is incorporated herein by reference. However, there are disadvantages in these prior art methods. Sacrificial films and templates tend to form pinch-offs on the top of the copper lines, forming triangular-shaped air gaps and increasing the dielectric constant.

Another prior art method of forming air gaps is forming air gaps using decomposable polyoxymethylene (POM), as described by John Sudijono in a presentation at IEDM 2004—Short Course entitled, "45 nm BEOL," p. 44, which is incorporated herein by reference. FIGS. 1 through 4 show cross-sectional views of this prior art method of forming air gaps at various stages of manufacturing.

Figure 1:
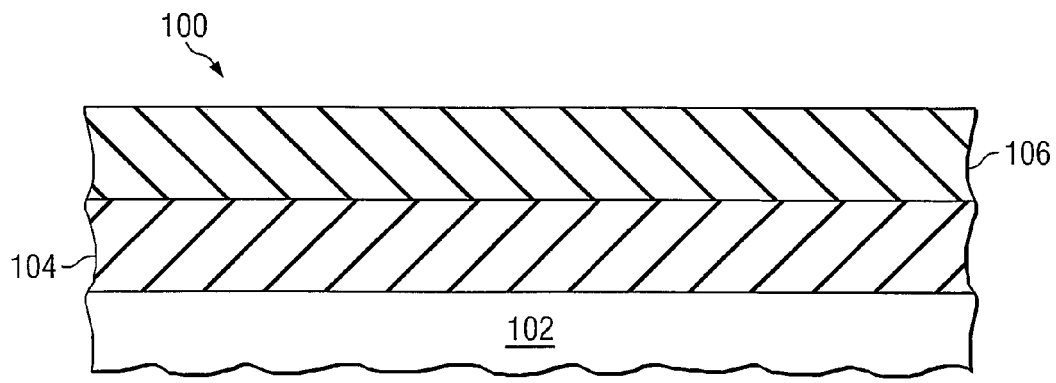
FIGS. 1 through 4 show cross-sectional views of a prior art method of forming air gaps at various stages of manufacturing that requires a high dielectric constant cap layer for stability.
Figure 2:
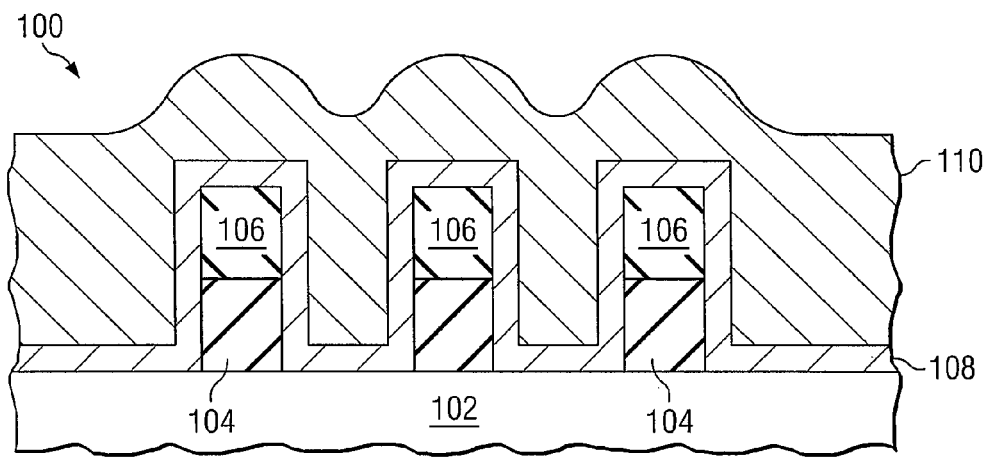
Figure 3:
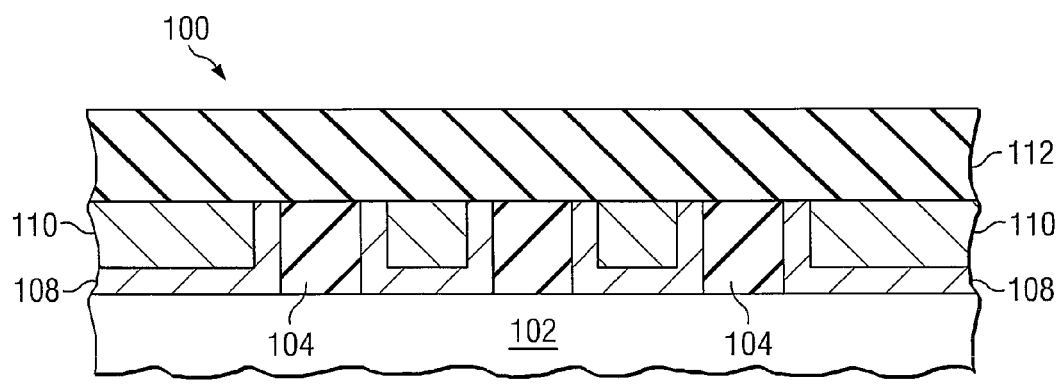

Referring first to FIG. 1, in this method of forming air gaps, a sacrificial material 104 comprising POM is deposited over a workpiece 102 that comprises a semiconductor wafer. A hard mask 106 is deposited over the sacrificial material 104. The hard mask 106 is patterned, and the hard mask 106 is used as a mask for the patterning of the sacrificial material 104. Shown in FIG. 2, a barrier seed layer 108 is formed over the patterned hard mask 106 and sacrificial material 104, and copper 110 is formed over the barrier seed layer 108 by plating. A chemical-mechanical polish process is used to remove the copper 110 and hard mask 106 from over the sacrificial material 104, as shown in FIG. 3. The copper 110 and barrier seed layer 108 comprise conductive lines in the interconnect structure.

Figure 4:
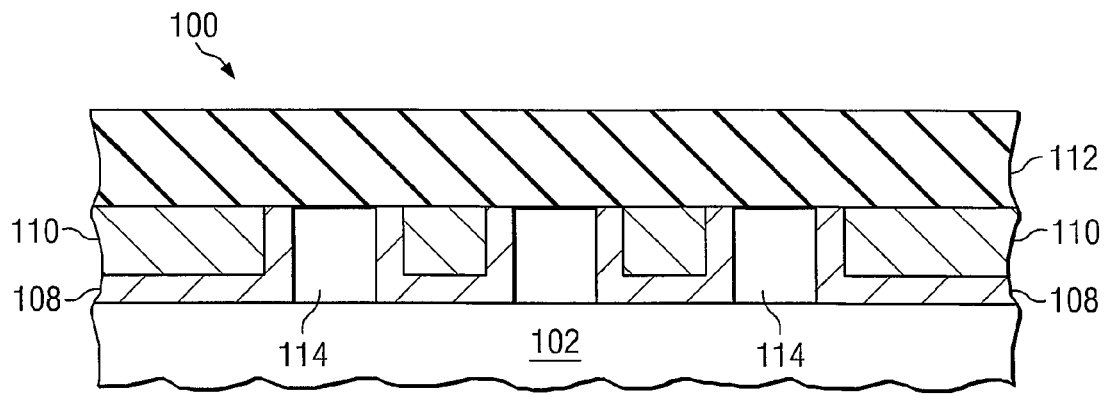

A dielectric layer 112 is then deposited over the conductive lines 108/110 and the sacrificial layer material 104, as shown in FIG. 3. The sacrificial material 104 is then decomposed by exposing the workpiece 102 to high temperature and pressure, leaving air gaps 114 formed between the conductive lines 108/110 beneath the dielectric layer 112, as shown in FIG. 4.

A problem with the prior art method and semiconductor device 100 shown in FIGS. 1 through 4 is that because low k dielectric materials are porous and structurally weak, the dielectric layer 112 comprises SiN or SiON, which have a high dielectric constant, e.g., greater than the dielectric constant of silicon dioxide. A low k dielectric material cannot be used for the dielectric layer 112 because that would introduce an instability problem and cause problems with CMP processes for later-deposited material layers. Thus, because a high k material, which may be relatively thick in some prior art applications, must be used for the overlying dielectric layer 112, the beneficial effects of the air gaps 114 between the conductive lines 108/110 are negated.

Figure 5:
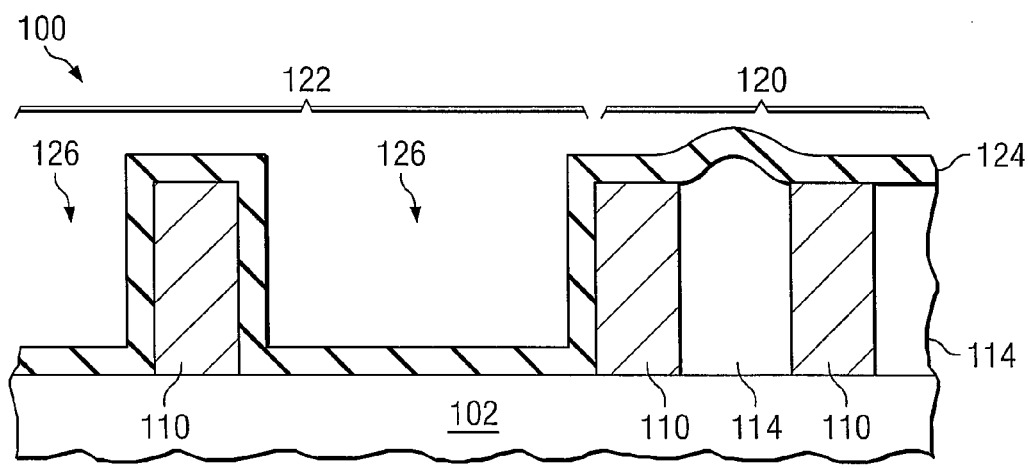
FIG. 5 shows another prior art conductive line structure with air gaps, wherein a topography is created in widely-spaced conductive line regions, which has a detrimental effect on lithography processes.

FIG. 5 shows another prior art conductive line structure with air gaps, wherein a topography is created in widely-spaced conductive line regions, which has a detrimental effect on lithography processes. In this approach, the workpiece 102 has regions where closely-spaced conductive lines 110 are formed in region 120 and where widely-spaced conductive features 110 are formed in region 122. A thin cap layer 124 is formed over air gaps 114 between the closely-spaced conductive lines 110 in region 120, as shown. The thin cap layer 124 may comprise SiN or SiON or other materials that provide structural support, for example. The air gaps 114 may be formed using the method described with reference to FIGS. 1 through 4, for example. The air gaps 114 are not typically needed in the region 122 having widely-spaced conductive lines 110, because the dielectric constant of the dielectric material is not a problem in that region 122, for example.

Because the thin cap layer 124 is deposited by chemical vapor deposition (CVD), it is conformal, and thus forms conformally on the widely-spaced conductive lines 110 in region 122, as shown. The depressions 126 in the topography of the semiconductor device are a problem in lithography processes, and decrease the depth of focus, for example, in the patterning of subsequently-deposited material layers (not shown). Thus, the size of features in subsequently-patterned material layers must be increased, because of the limitations in the lithography processing caused by the topography of the structure.

In other prior art methods of forming air gaps, a permeable material is deposited over a material that will be sacrificially removed. During the damascene formation of conductive lines, the permeable material allows contaminants from the CMP process to enter the permeable material and possibly even reach the sacrificial material. The contamination, such as the uptake of water and chemicals used in polishing or cleaning or adhesion of slurry particles or CMP byproducts, can lead to cross-contamination, a change in the value of the dielectric constant between conductive lines, and can cause reliability issues.

Thus, what are needed in the art are improved methods of forming air gaps between conductive features that do not require a high dielectric constant cap layer, do not introduce topography to the structure, and that protect underlying material layers from contaminants in the CMP processes and cleaning processes.

Embodiments of the present invention achieve technical advantages by providing methods of forming air gaps between interconnects of integrated circuits and structures thereof. A first insulating material is deposited over a workpiece, and a second insulating material having a sacrificial portion is deposited over the first insulating material. Conductive lines are formed in the first and second insulating layers. The second insulating material is treated to remove the sacrificial portion, and at least a portion of the first insulating material is removed, forming air gaps between the conductive lines. The second insulating material is impermeable as deposited, and permeable after treating it to remove the sacrificial portion.

In one embodiment, a first region of the workpiece may be masked during the treatment, so that the second insulating material becomes permeable in a second region of the workpiece yet remains impermeable in the first region, thus allowing the formation of air gaps in the second region, but not the first region. In this embodiment, the air gaps are preferably formed in areas of the chip where a low-k material is most beneficial, for example. In areas of the chip where the RC delay is not as critical, air gaps are preferably not formed. Thus, the regions not having air gaps provide a high mechanical strength for the interconnect structure, resulting in an integrated circuit with air gaps that has a stable structure.

Several methods of manufacturing integrated circuits in accordance with preferred embodiments of the present invention will be described herein. The present invention will be described with respect to preferred embodiments in a specific context, namely a semiconductor device having a single layer of interconnect. The invention may also be applied, however, to semiconductor devices having multiple layers of interconnect. For example, the air gaps may be formed in one or more interconnect layers of a semiconductor device. Also, in the figures, the conductive lines are formed using a damascene process; however, embodiments of the present invention also have application in semiconductor devices wherein conductive lines are formed using subtractive etch processes, for example.

Figure 6:
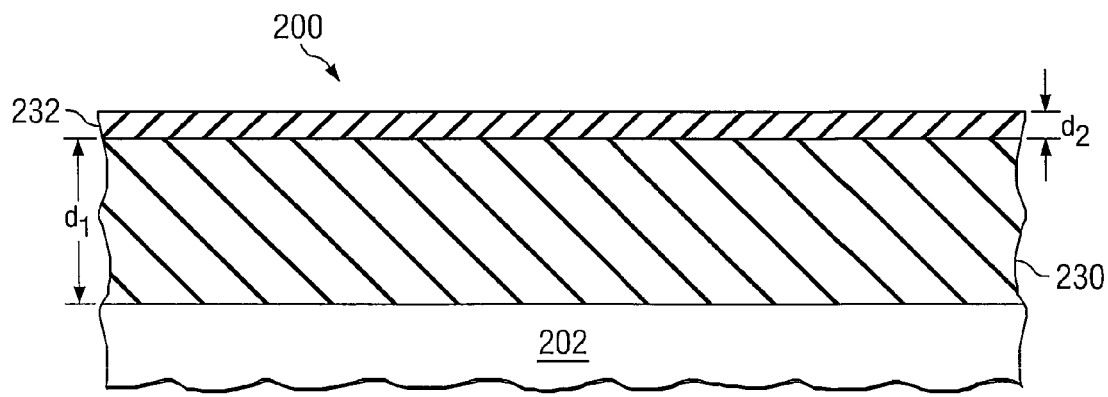
FIGS. 6 through 11 show cross-sectional views of a method of forming air gaps at various stages of manufacturing in accordance with a preferred embodiment of the present invention, wherein a sacrificial portion of a second insulating material is removed so that a first insulating material may be removed through the second insulating material to form the air gaps.

FIGS. 6 through 11 show cross-sectional views of a method of forming air gaps at various stages of manufacturing in accordance with a preferred embodiment of the present invention, wherein a sacrificial portion of a second insulating material is removed so that a first insulating material may be removed through the second insulating material to form air gaps. With reference to FIG. 6, a semiconductor device 200 is shown. The semiconductor device 200 comprises a workpiece 202. The workpiece 202 may include a semiconductor substrate comprising silicon or other semiconductor materials that may be covered by an insulating layer, for example. The workpiece 202 may include active components or circuits formed in the FEOL, not shown. The workpiece 202 may comprise silicon oxide over single-crystal silicon, for example. The workpiece 202 may include other conductive layers or other semiconductor elements, e.g. transistors, diodes, etc. Compound semiconductors, GaAs, InP, Si/Ge, or SiC, as examples, may be used in place of silicon.

A first insulating material 230 is formed over the workpiece 202. The first insulating material 230 preferably comprises a sacrificial material that is removable by reactive ion etch (RIE), anneal, or is easily decomposable at higher temperatures, in accordance with embodiments of the present invention. The first insulating material 230 preferably comprises an organic polymer such as polynorbornene, as examples, although alternatively, the first insulating material 230 may comprise other organic polymers or other materials. The first insulating material 230 may be deposited by a spin-on process, physical vapor deposition (PVD), or CVD, as examples, although alternatively, the first insulating material 230 may be deposited using other methods. The first insulating material 230 preferably comprises a thickness $d_1$ of about 2,000 Angstroms or less, and more preferably, comprises a thickness of about 1,000 Angstroms, as examples, although alternatively, the first insulating material 230 may comprise other dimensions.

A second insulating material 232 is formed over the first insulating material 230. The second insulating material 232 preferably comprises a thickness $d_2$ that is less than the thickness $d_1$ of the first insulating material 230, in one embodiment. The thickness $d_2$ preferably comprises about 600 Angstroms or less, and more preferably comprises a thickness of about 200 to 500 Angstroms, as examples, although alternatively, the second insulating material 232 may comprise other dimensions. The thickness $d_1$ of the first insulating material 230, of which at least a portion will be removed, is preferably as thick as possible, to achieve the lowest possible dielectric constant when the air gaps 242 (see FIG. 11) are formed in the structure, for example. The second insulating material 232 and the first insulating material 230 comprise an inter-level dielectric (ILD) layer, in one embodiment, for example.

The thicknesses $d_1$ and $d_2$ of the first and second insulating materials 230 and 232, respectively, depends on the thickness of the conductive lines 210 that will be formed, to be described further herein. In accordance with embodiments of the present invention, it is desirable to achieve a good compromise between maximum air gap volume (e.g., which is determined by the thickness $d_1$ of the first insulating material 230) and structural stability (which is a function of the thickness $d_2$ of the second insulating material 232). A thickness $d_1$ of the first insulating material 230 of about 66-75% of the conductive line 210 thickness, and a thickness $d_2$ of the second insulating material 232 of about 34-25% of the conductive line 210 thickness, are preferred thicknesses $d_1$ and $d_2$ of the first and second insulating materials 230 and 232, in some embodiments, for example. However, in other embodiments, the thickness $d_2$ may be about 40-50% of the conductive line 210 thickness, e.g., if the second insulating material 232 is made permeable by converting a polymer with lower Si content into a $SiO_2$-type skeleton/mesh structure via an $O_2$ treatment, for example, to be described further herein.

A portion of the second insulating material 232 preferably comprises SiCO, an organic polymer such as polyoxymethylene that is relatively volatile when exposed to a heat treatment, or $SiO_2$, as examples, although alternatively, the second insulating material 232 may comprise other organic polymers or other materials. The second insulating material 232 may be deposited by a spin-on process, PVD, or CVD, as examples, although alternatively, the second insulating material 232 may be deposited using other methods.

The second insulating material 232 is preferably impermeable as deposited, in accordance with an embodiment of the present invention. The second insulating material 232 preferably comprises a sacrificial portion that will later be removed, to be described further herein.

Figure 7:
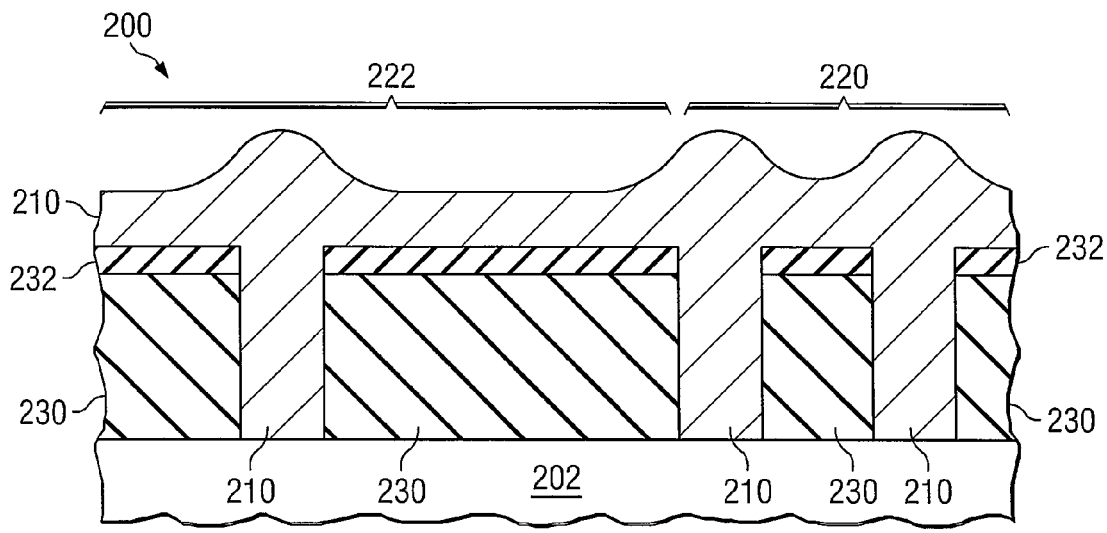

Next, a damascene process is used to form conductive lines within the second insulating material 232 and the first insulating material 230. The second insulating material 232 and the first insulating material 230 are patterned with a desired pattern for conductive lines, as shown in FIG. 7. For example, a photoresist (not shown) and an optional hard mask (also not shown) are deposited over the second insulating material 232, and the photoresist is patterned. The photoresist is used as a mask while exposed portions of the second insulating material 232 and the first insulating material 230 are etched away, or, if a hard mask is used, the photoresist is used as a mask to pattern the hard mask, the photoresist is removed, and the hard mask is used as a mask while exposed portions of the second insulating material 232 and first insulating material 230 are etched away. The workpiece 202 and/or pattern may include a first region 220 of closely-spaced conductive lines and a second region 222 of widely-spaced conductive lines, as shown. The distance between the conductive lines in the second region 222 may be about 2 times or greater than the distance between the conductive lines in the first region 220, for example.

A conductive material 210 is deposited over the patterned second insulating material 232 and the first insulating material 230, as shown in FIG. 7. The conductive material 210 preferably comprises copper, aluminum, alloys thereof, or other conductive materials or combinations of materials. One or more barrier layers, liners, and/or seed layers (not shown) may be formed over the exposed portion of the workpiece 202 and the patterned second insulating material 232 and the first insulating material 230 before depositing the conductive material 210, for example. If the conductive material 210 comprises copper, which has a high diffusion rate, preferably one or more barrier layers are used to prevent the copper from diffusing into adjacent material layers, for example. The conductive material 210 fills in the patterns in the second insulating material 232 and the first insulating material 230, and also resides over the top surface of the second insulating material 232, as shown in FIG. 7.

Figure 8:
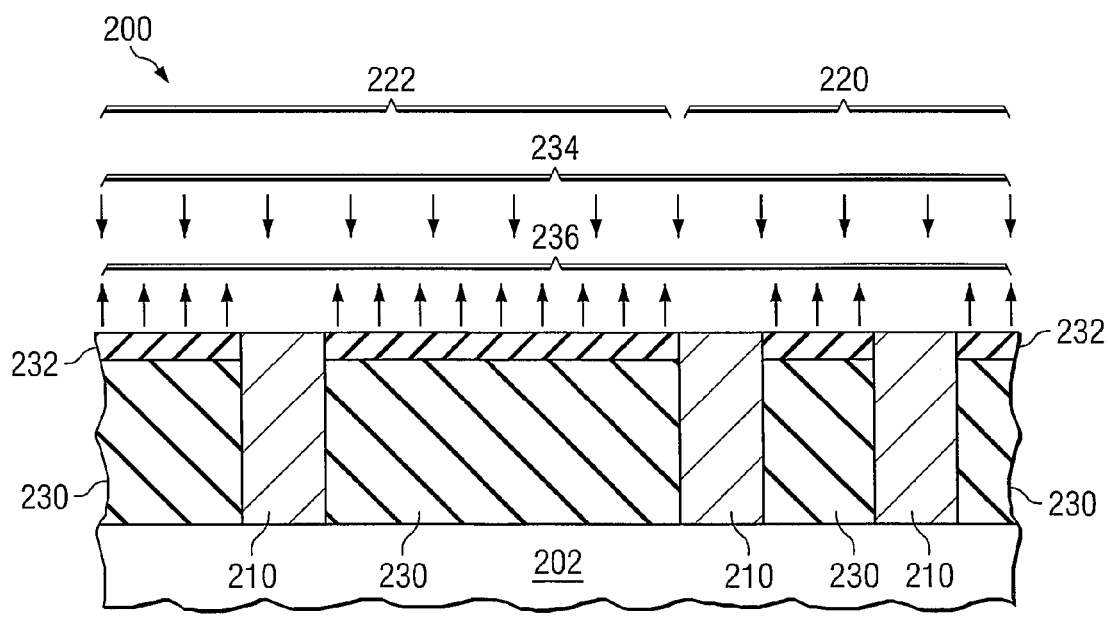

Next, a CMP process and/or etch process is used to remove the conductive material 210 from the top surface of the second insulating material 232 and form conductive lines 210 in the second insulating material 232 and the first insulating material 230, leaving the structure shown in FIG. 8. The conductive lines 210 are also referred to herein as conductive features, for example. The second insulating material 232 preferably comprises a material that is adapted to protect the first insulating material 230 from contaminants that the workpiece 202 is exposed to during the CMP process and cleaning processes that may follow the CMP process, for example. Because the second insulating material 232 is preferably impermeable as deposited, advantageously, the second insulating material 232 protects the first insulating material 230 from possible contamination; e.g., from uptake of water and chemicals in polishing or cleaning steps, adhesion of slurry particles or CMP by-products, which could possibly lead to cross-contamination and/or change in the dielectric constant (k) value, or cause reliability issues, as examples.

In accordance with preferred embodiments of the present invention, the second insulating material 232 is treated with a treatment 234 to remove the sacrificial portion 236 of the second insulating material 232, as shown in FIG. 8. The treatment 234 may comprise a RIE or an anneal process, for example. The exposed top surfaces of the conductive lines 210 are preferably not deleteriously affected by the treatment 234.

In one embodiment, the sacrificial portion 236 that is removed comprises portions of the second insulating material 232. In this embodiment, the treatment 234 comprises a RIE that is used to pattern the second insulating material 232 with a plurality of apertures 238. A mask may be used to pattern the second insulating material 232, e.g., by depositing a photoresist, patterning the photoresist, and using the photoresist as a mask during the etch process for the second insulating material 232. The second insulating material 232 preferably comprises SiCO, $SiO_2$, or polyoxymethylene in this embodiment, as examples, although alternatively, the second insulating material 232 may comprise other materials.

The plurality of apertures 238 is preferably very small, and may comprise a minimum feature size of the semiconductor device 200, for example. In some embodiments, very small aperture 238 sizes in the second insulating material 232 may be created lithographically by the application of so-called "shrink methods," such as a resist reflow process, or by the use of products such as RELACS™ by Mitsubishi Electric Corporation, or CARL™ by Siemens Aktiengesellschaft. In a resist reflow process, a patterned layer of contact holes in resist is subjected to a heat treatment until the resist starts to flow, which leads to shrinkage of the bottom critical dimension (CD) of the holes, for example. These shrink methods advantageously allow minimum aperture 238 sizes to be formed that are smaller than the inherent resolution capability of the optical system, for example. The chemical or reflow bias of these methods may be exceeded beyond the generally used range (e.g., about 30-40 nm/edge) at the expense of reduced process control. However, advantageously, in the application of embodiments of the present invention, there is relaxed CD control required, in comparison to routine lithography applications, for example, and such shrink methods may thus be utilized to form the apertures 238.

In another embodiment, the sacrificial portion 236 comprises a sacrificial component of the second insulating material 232 that is heat-sensitive. In this embodiment, the treatment to remove the sacrificial portion 236 of the second insulating material 232 may comprise an anneal process or heat treatment. For example, the treatment 234 may comprise an anneal process at a temperature of about 300 to 400 degrees C. for about 0.5 to 60 minutes, wherein the anneal process is adapted to remove the heat-sensitive component of the second insulating material 232, e.g., the sacrificial component 236, although other temperatures and times may be used.

If the second insulating material 232 comprises SiCO, then the heat-sensitive component 236 may comprise C, and the treatment 234 causes the C to leave the second insulating material 232, for example. Alternatively, if the second insulating material 232 comprises an organic polymer, the heat-sensitive component 236 may comprise polynorbornene or other materials, as examples. When the heat-sensitive component 236 leaves the second insulating material 232, pores 238 are formed in the second insulating material 232, as shown in FIG. 9.

Figure 9:
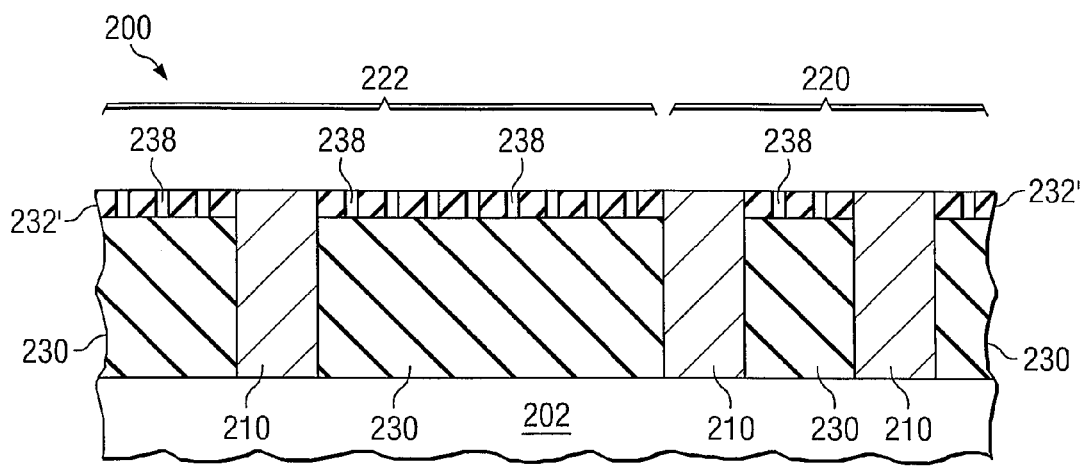

Thus, removing the sacrificial portion 236 of the second insulating material 232 using the treatment 234 comprised of either a RIE or heat treatment preferably results in the formation of pores or apertures 238 in the second insulating material 232 in accordance with embodiments of the present invention, as shown in FIG. 9. The second insulating material 232 shown in FIG. 8 is changed after the treatment 234 and is represented by 232' in FIGS. 9 through 11, for example. In particular, the second insulating material 232' includes apertures or pores 238 that were not present in the second insulating material 232 as deposited; thus, the second insulating material 232' is permeable after the treatment 234. For example, the second insulating material 232' is adapted to allow liquids or gases to pass through the pores or apertures 238.

Preferably, the second insulating material 232' is permeable to the extent that at least a portion of the first insulating material 230 or all of the first insulating material 230 may pass through the pores or apertures 238 of the second insulating material 232'. If a heat-sensitive component of the second insulating material 232 was removed during the treatment 234, then the second insulating material 232' shown in FIGS. 9 through 11 is absent at least a portion of the heat-sensitive component of the second insulating material 232 as deposited, for example.

Figure 10:
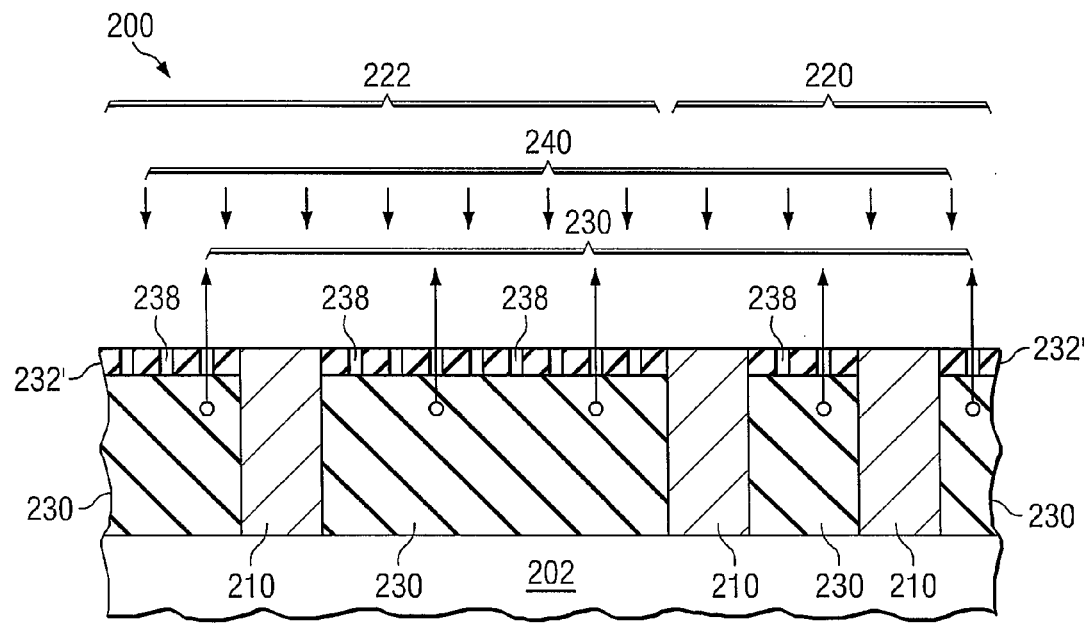
Figure 11:
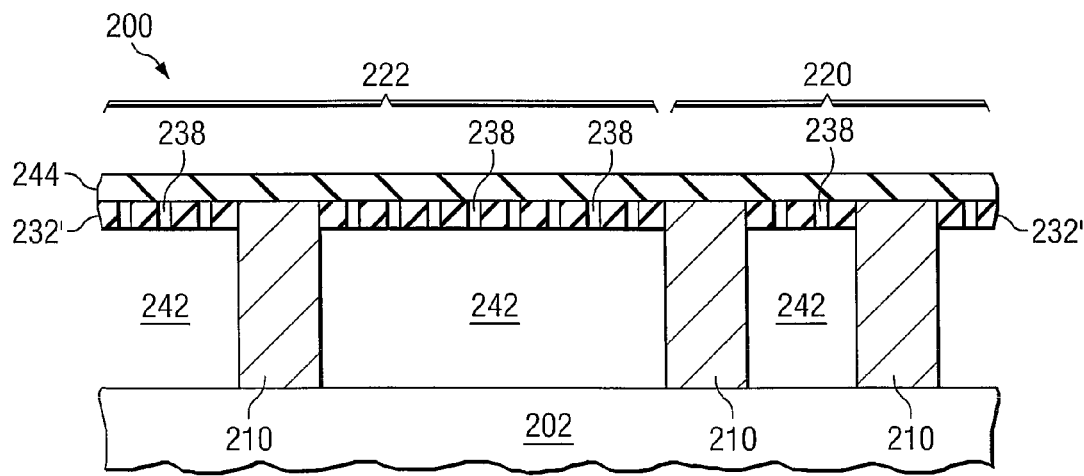

Next, at least a portion of the first insulating material 230 is removed through the pores or apertures 238 in the second insulating material 232, as shown in FIG. 10, forming air gaps 242 between the conductive lines 210 beneath the second insulating material 232', as shown in FIG. 11. This may be accomplished by another treatment process 240 comprising a RIE or heating process, for example, as shown in FIG. 10. Preferably, if a RIE is used to remove the first insulating material 230, the second insulating material 232 comprises a material that is adapted not to be etched away by the RIE process to remove the first insulating material 230, for example. If an anneal process is used to remove the first insulating material 230, then the anneal process may comprise a temperature of about 400 degrees C. or greater for about 0.5 to 60 minutes, as an example, although other temperatures and times may be used.

Next, five examples of combinations of materials and preferred methods of processing the first insulating material 230 and the second insulating material 232 in accordance with embodiments of the present invention will be described. In a first material combination example, the first insulating material 230 preferably comprises non-photosensitive fine chemicals (NFC) by JSR Micro, Inc., which is an aromatic hydrocarbon-based spin-on material also known as a BEOL material that is spun-on and baked. The first insulating material 230 may also comprise BLACK DIAMOND™ by Applied Materials, Inc., which is a low dielectric constant material that may be deposited by CVD. The second insulating material 232 preferably comprises a spin-on-glass that is spin coated and hard-baked, e.g., at a temperature of about 350 degrees C. The second insulating material 232 is then lithographically patterned (this comprises the treatment 234 in this embodiment) with small apertures 238 using a shrink method such as reflow, RELACS™ or CARL™. The first insulating material 230 is then removed using $O_2$ plasma, and optionally also using heat assistance, e.g., by elevating the temperature to about 100 to 300 degrees C. This material selection for the first and second insulating materials 230 and 232, respectively, is advantageous in that the first insulating material 230 is carbonaceous, yet the second insulating material 232 is carbon-free, for example.

In a second material combination example, the first insulating material 230 preferably comprises polynorbornene. The second insulating material 232 preferably comprises a spin-on-glass that is spin coated and hard-baked, e.g., at a temperature of about 350 degrees C. The second insulating material 232 is then lithographically patterned (treatment 234) with small apertures 238 using a shrink method such as reflow, RELACS™ or CARL™. The first insulating material 230 is then removed using thermal decomposition, at a temperature of about 400 degrees C. or greater. This material selection is also advantageous in that the first insulating material 230 is carbonaceous, yet the second insulating material 232 is carbon-free, for example.

In a third material combination example, the first insulating material 230 preferably comprises polynorbornene. The second insulating material 232 preferably comprises a low k material with a sacrificial component 236 comprising a high porogen content that decomposes at a temperature lower than the decomposition temperature of the first insulating material 230. The second insulating material 232 may comprise polypropylene or polyoxymethylene, as examples. A thermal treatment 234 is then used to thermally remove the porogen sacrificial component 236, e.g., at a temperature of about 200 to 350 degrees C. The first insulating material 230 is then removed using thermal decomposition, at a temperature of about 400 degrees C. or greater. This material selection is advantageous because the second insulating material 232 comprises at least two components, wherein one component is thermally labil.

In a fourth material combination example, the first insulating material 230 preferably comprises NFC or BLACK DIAMOND™, as described in the first example. The second insulating material 232 preferably comprises a siloxane-organic co-polymer of moderate Si content, e.g., about 10 to 20% Si. An $O_2$ plasma treatment 234 thermal treatment 234 is then used to convert the second insulating material 232 into a porous semiconductor material 232' having vertical channels or pores 238. The first insulating material 230 is then removed using $O_2$ plasma, and optionally also using heat assistance, e.g., by elevating the temperature to about 100 to 300 degrees C. In this embodiment, the second insulating material 232 may function as an inadequate bi-layer resist, for example.

In a fifth material combination example, the first insulating material 230 preferably comprises polynorbornene. The second insulating material 232 preferably comprises a siloxane-organic co-polymer of moderate Si content, e.g., about 10 to 20% Si. An $O_2$ plasma treatment 234 thermal treatment 234 is then used to convert the second insulating material 232 into a porous semiconductor material 232' having vertical channels or pores 238. The first insulating material 230 is then removed using thermal decomposition, at a temperature of about 400 degrees C. or greater.

Note that the material combinations are included merely as example; alternatively, other materials and treatments may be used to form an impermeable second insulating material 232 over the first insulating material 230, convert the impermeable second insulating material 232 to a permeable insulating material 232', and remove the first insulating material 230, forming air gaps 242 beneath the permeable insulating material 232'.

The optional barrier layer or liner (not shown in the figures) that may be deposited before depositing the conductive material 210 of the conductive lines 210 protects the sidewalls of the conductive lines 210 during the removal of the first insulating material 230, and also during the removal of the sacrificial portion 236 of the second insulating material 232, for example.

In some embodiments, preferably, all of the first insulating material 230 is removed from beneath the second insulating material 232', as shown in FIG. 11. This is advantageous because the lowest possible dielectric constant is achieved between the conductive lines 210. However, in other embodiments, a portion of the first insulating material 230 may remain beneath the second insulating material 232', for example (not shown in the figures). For example, the first conductive material 230 left remaining may reside on the bottom corners of the workpiece 202/conductive line 210, the top surface of the workpiece 202, or the sidewalls of the conductive lines 210, as examples. Preferably, an air gap is formed in at least part of the area between the conductive lines 210 that was previously occupied by the first insulating material 230, for example. Also, preferably, at least 80% of the first insulating material 230 is removed from beneath the second insulating material 232' in accordance with an embodiment of the present invention, forming an air gap 242 in at least 80% of the space between the conductive lines 210, for example.

Note that preferably, the sacrificial portion 236 of the second insulating material 232 comprises a material with a decomposition temperature that is lower than the decomposition temperature of the first insulating material 230 beneath the second insulating material 232. This will prevent the first insulating material 230 from beginning to decompose before the second insulating material 232 is fully permeable. Premature decomposition of the first insulating material 230 may lead to lift-off of the second insulating material 232 or cracks in the overall structure of the semiconductor device 200, for example.

Preferably, in some embodiments, after removing at least a portion of the first insulating material 230 to form the air gaps 242, the manufacturing of the semiconductor device 200 is then continued to complete the semiconductor device 200. For example, additional insulating and conductive material layers may be deposited over the top surface of the conductive lines 210 and second insulating material 232' and patterned to form additional interconnect layers, not shown. The embodiments of the invention described herein may be repeated on one or more additional interconnect layers, for example. The pores or apertures 238 of the second insulating material 232' are preferably small enough that the subsequently deposited material layers will not enter into the air gaps 242 formed between the conductive lines 210 beneath the second insulating material 232', in this embodiment.

In other embodiments, a cap layer 244 is preferably deposited over the top surface of the conductive lines 210 and second insulating material 232', as shown in FIG. 11. The cap layer 244 preferably comprises an insulating material. The cap layer 244 preferably comprises about 500 Angstroms or less of SiCN, although alternatively, the cap layer 244 may comprise other dimensions and materials, for example. The cap layer 244 may comprise SiN or an oxide, for example, although if the cap layer 244 comprises a high dielectric constant, preferably the cap layer 244 is as thin as possible, to avoid a large degradation in the effective k value of the insulating material between the conductive lines 210. The cap layer 244 is preferably conformal and may be deposited by CVD, PVD, or other deposition methods, as examples, although the cap layer 244 alternatively may be deposited by other methods.

The cap layer 244 preferably comprises an impermeable material so that no contaminants or subsequently deposited material may enter through the pores 238 of the second insulating material 232 and enter the air gaps 242, for example. The pores or apertures 238 of the second insulating material 232' are preferably small enough such that, and the cap layer 244 comprises a material such that, the cap layer 244 will not enter into the air gaps 242 formed between the conductive lines 210 beneath the second insulating material 232'. In some embodiments, for example, the second insulating material 232' preferably comprises a relatively structurally strong material, so that a thin cap layer 244 may be used, wherein the primary function of the thin cap layer 244 is to seal the pores or apertures 236 in the second insulating material 232', thus minimally affecting the effective k value, for example.

The manufacturing of the semiconductor device 200 is then continued to complete the semiconductor device 200. For example, additional insulating and conductive material layers may be deposited over the top surface of the cap layer 244 to form additional interconnect layers, not shown. Again, the embodiments of the invention described herein may be repeated in one or more additional interconnect layers of the semiconductor device 200, for example.

Figure 12:
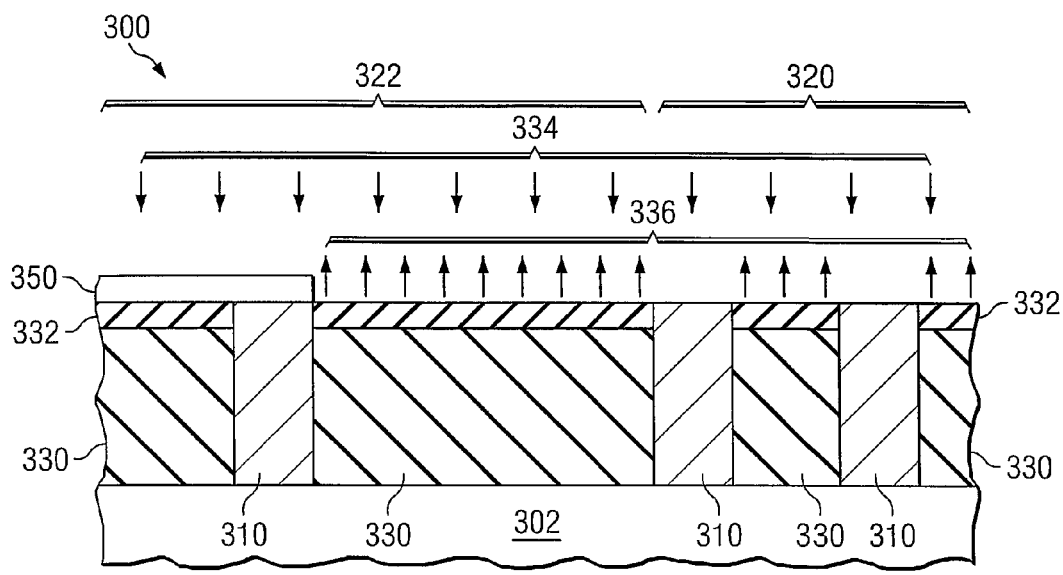
FIGS. 12 and 13 show another embodiment of the present invention, wherein the air gaps are formed in closely-spaced regions of an interconnect layer, but not widely-spaced regions.
Figure 13:
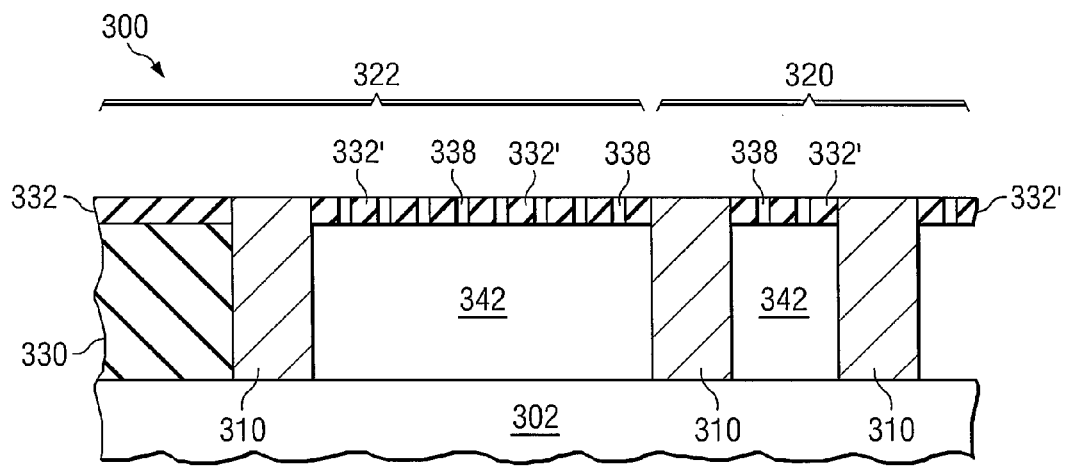

FIGS. 12 and 13 show another embodiment of the present invention, wherein the air gaps 342 are formed in closely-spaced regions of an interconnect layer, but not widely-spaced regions. Similar process flows and materials are preferably used as were described with reference to the embodiments shown in FIGS. 6 through 11. Similar reference numbers are designated for the various elements in FIGS. 12 and 13 as were used in FIGS. 6 through 11. To avoid repetition, each reference number shown in FIGS. 12 and 13 is not described in detail herein. Rather, similar materials and thicknesses described for x02, x30, x32, etc. are preferably used for the material layers shown as were described for FIGS. 6 through 11, where x=2 in FIGS. 6 through 11 and x=3 in FIGS. 12 and 13.

In this embodiment, after the excess conductive material 210 is removed from the top surface of the second insulating material 232 (shown in FIGS. 7 and 8), yet before the treatment 234 is used to remove the sacrificial portion 236 of the second insulating material 232 (see FIG. 8) one region of the workpiece 302, such as a portion of region 322 as shown in FIG. 12, is covered with a mask 350 before exposing the second insulating material 332 in other regions 320 to the treatment 334. The mask 350 may comprise a photoresist, hard mask, other materials, or combination thereof, as examples. In this embodiment, after treating the second insulating material in regions 320 (and also portions of region 322 not covered by the mask 350), the second insulating material 332' is permeable in the region 320 and portions of region 322, and the second insulating material 332 is impermeable in portions of region 322, as shown in FIG. 13. In this embodiment, preferably, at least a portion of the first insulating material 332 comprises removing at least a portion of the first insulating material 332 in some regions 320, but not other regions (portions of region 322), of the workpiece 320. Air gaps 342 are then formed beneath the permeable second insulating material 332' by removing at least a portion of the first insulating material 330 through the second insulating material 332' in some regions 320 (and also portions of regions 322) but not in other regions, thus leaving the first insulating material 330 disposed beneath the impermeable second insulating material 332 in some regions 322, as shown.

In this embodiment, the conductive lines 310 may comprise widely-spaced conductive lines 310 in the region 322 of the workpiece 302 and air gaps 342 formed between closely-spaced conductive lines 310 in region 320 of the workpiece 302, as shown in FIGS. 12 and 13. This is advantageous because the air gaps 342 are formed in areas where they are most beneficial, e.g., in region 320 having closely-spaced conductive lines 310. However, in accordance with other embodiments of the present invention, alternatively, the conductive lines 310 in region 320 may be covered with a mask 350 during the treatment so that air gaps 342 are formed in region 322, for example, not shown. Alternatively, in some applications it might be advantageous to form air gaps 342 in particular functional blocks of a semiconductor device 300 having a plurality of various conductive line spacings (not shown), for example.

Referring again to FIG. 13, the region 320 having the air gaps 342 is not necessarily much less structurally stable or strong as the portion of region 322 not having the air gaps 342 formed therein, because the density of the conductive lines 310 in region 320 is greater, thus providing additional mechanical support to region 320, for example. The portion of region 322 having the air gaps 342 formed therein may be mechanically strengthened by the use of a cap layer 244, as shown in FIG. 11, for example.

Figure 14:
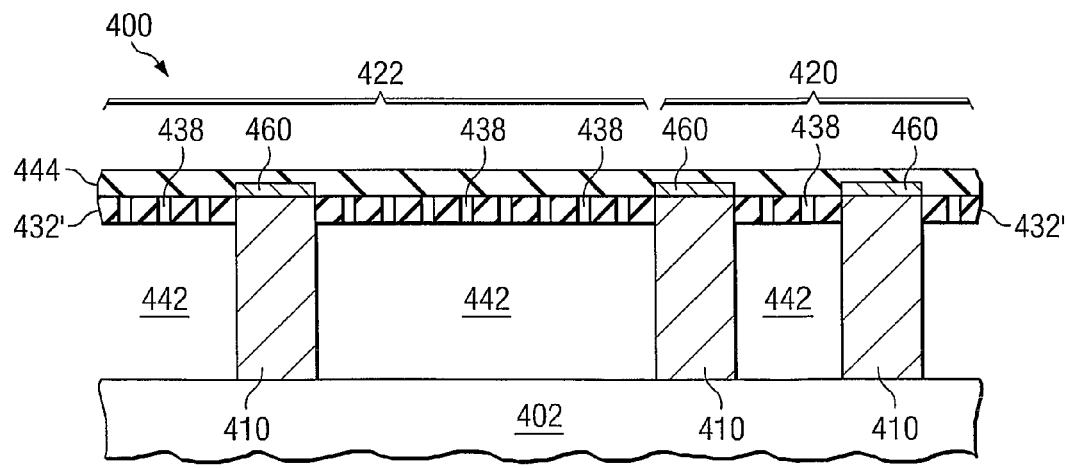
FIG. 14 shows another embodiment of the present invention, wherein a conductive cap layer is selectively formed on the top surface of conductive features after forming the air gaps.

FIG. 14 shows another embodiment of the present invention, wherein an optional conductive cap layer 460 is selectively formed on the top surface of conductive lines 410. The optional conductive cap layer 460 may be formed either before or after forming the air gaps 442. Again, similar reference numbers are designated for the various elements in FIG. 14 as were used in the previous figures, and to avoid repetition, each reference number shown in FIG. 14 is not described in detail herein.

In one embodiment, for example, the conductive cap layer 460 is selectively formed prior to forming the air gaps 442, to protect the top surface of the conductive lines 410. In particular, the conductive cap layer 460 may be formed before treating the second insulating material 438 to form the pores or apertures 438, because the RIE or other treatment process may cause the top surface conductive lines 410 to oxidize or may otherwise deleteriously affect the top surface of the conductive lines 410, for example.

To form the optional cap layer 460, preferably a selective process is used to form the cap layer 460 only over the conductive lines 410, and not over the second insulating layer 432'. The cap layer 460 may comprise about 200 Angstroms or less of CoW, CoWP, or TaN, as examples, although alternatively, the cap layer 460 may comprise other dimensions and materials. Cap layer 444 may then be deposited over cap layer 460 and the second insulating material 432', as shown.

Embodiments of the present invention may also be used to form air gaps in structures where the conductive lines are formed in a subtractive etch process. For example, referring to FIG. 8, a workpiece 202 is provided, and a layer of conductive material 210 is deposited over the entire surface of the workpiece 202. The conductive material 210 is then patterned and etched using lithography to form conductive lines 210. The first insulating material 230 is deposited between the conductive lines 210 and over the top surface of the workpiece 202, and the second insulating material 232 is deposited over the first insulating material 230 between the conductive lines 210. The manufacturing process steps described with reference to FIGS. 8 through 11 are then continued as described herein, altering the second insulating material 232 by removing a sacrificial portion 236 of it (FIGS. 8 and 9), removing the first insulating material 230 through the second insulating material 232 (FIG. 10) and forming air gaps 242 beneath the second insulating material 232' (FIG. 11).

The conductive lines 210 may also be formed in a damascene process using a sacrificial oxide layer, not shown. In this embodiment, a sacrificial oxide layer or other insulating material is deposited over the workpiece 202, and the sacrificial oxide layer is patterned with the desired pattern for the conductive lines 210. The conductive material 210 is deposited over the patterned sacrificial oxide layer, and a CMP process is used to remove excess conductive material from the top surface of the sacrificial oxide layer and form the conductive lines 210. The sacrificial oxide layer is then removed from between the conductive lines 120. Next, the first insulating material 230 is deposited over the conductive lines 210 and may be etched back to a predetermined height, exposing, for example, about ⅓ to ¼ of the top portions of the conductive lines 210. The second insulating material 232 is then deposited over the first insulating material 230 and over the exposed tops of the conductive lines 210. A CMP process is used to remove excess second insulating material 232 from over the top surfaces of the conductive lines 210. The second insulating material 232 is then made permeable using the treatment 234 comprising lithography or a thermal treatment, as previously described herein. The first insulating material 230 is then removed, and a thin cap layer may then optionally be formed on the top surfaces of the permeable second insulating material 232 and the conductive lines 210.

Embodiments of the invention are particularly useful in multi-level interconnect structures. There may be 8, 9 or a dozen or more metallization layers in an interconnect structure, for example. However, embodiments of the present invention are also useful in single level interconnect structures, for example.

Preferably, in some embodiments, the air gaps 242, 342, and 442 described herein are formed between densely packed conductive lines 210, 310, and 410 in order to reduce the RC delay of the interconnect structure. For example, in a memory chip, air gaps 242, 342, and 442 are preferably formed between the interconnect overlying the memory array that is densely packed (e.g., the conductive lines and spaces therebetween may comprise a minimum feature size of the chip), yet air gaps 242, 342, and 442 may not necessarily be formed in the interconnect regions of periphery circuits and support circuits, which may be less densely packed, although in some embodiments, air gaps 242, 342, and 442 may also be formed in those regions. As another example, in a microprocessor chip, in lower and/or intermediate levels of interconnect (e.g., the first through third metallization layers) that are densely packed, air gaps 242, 342, and 442 are preferably formed between conductive lines, yet at higher or upper-most levels of interconnect, which are less densely packed, no air gaps 242, 342, and 442 may be formed.

Regardless of a particular application for an integrated circuit, air gaps 242, 342, and 442 may be formed in some regions of an interconnect layer, providing an extremely low dielectric constant in those regions. Again, in some embodiments of the invention, as shown in FIGS. 12 and 13, other regions of the same interconnect layer preferably have higher dielectric constant material 330 disposed between the conductive lines 310 (e.g., in portions of region 322), which provides a more stable structure, thus producing an overall interconnect structure that is mechanically stable and reliable.

Embodiments of the present invention are particularly beneficial for integrated circuits that are application specific, that require a high performance BEOL and low RC delay, and that utilize copper as the material for the conductive lines, for example. Embodiments of the invention may be implemented in applications such as microprocessors, game station integrated circuits, and cell phone integrated circuits, as examples, although the invention may be used in other types of integrated circuits. However, embodiments of the present invention are also useful in other applications, having fewer metallization layers and utilizing aluminum as the material for the conductive lines, for example.

Advantages of embodiments of the invention include forming air gaps 242, 342, and 442, achieving a low dielectric constant between conductive lines 210, 310, and 410. Because the majority of the space between conductive lines 210, 310, and 410 comprises the air gaps 242, 342, and 442, a dielectric constant of about 2.2 or lower between the conductive lines 210, 310, and 410 is achievable.

Advantages of preferred embodiment of the present invention include providing novel methods of forming air gaps 242, 342, and 442 between conductive features 210, 310 and 410. Air gaps 242, 342, and 442 having a predictable shape and a predetermined height over a wide range of spaces are created. No additional topography is introduced to the semiconductor devices 200, 300, and 400, and few additional processing steps are required.

In some embodiments, air gaps 242, 342, and 442 are formed between conductive features 210, 310, and 410 in critical areas, but not in non-critical areas, where the RC delay is not an issue. Because some regions of the workpiece 202, 302, and 402 do not have the air gaps 242, 342, and 442 disposed therein, the insulating material 330 in those regions provides strong structural support and mechanical strength for the integrated circuit. Advantageously, air gaps 242, 342, and 442 may be formed in some regions but not others, while maintaining the planarity of the topography of the layer of interconnect/ILD.

The top layer of insulating material 232, 332 and 432 having the sacrificial portion 236 is impermeable as deposited, preventing contamination of the various material layers (e.g., underlying material layers and also the insulating material layer 232, 332, and 432 itself) during a chemical-mechanical polish procedure to remove excessive conductive material from the top surface of the top layer of insulating material 232, 332 and 432, while forming the conductive lines 210, 310, 410 in a damascene process.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a workpiece, the workpiece comprising a first region and a second region;
   a plurality of conductive lines formed over the workpiece, the plurality of conductive lines having a top region;
   a first insulating material disposed between the plurality of conductive lines and proximate the top region of the plurality of conductive lines, the first insulating material being impermeable in the first region and permeable in the second region;
   a second insulating material disposed beneath the first insulating material between the plurality of conductive lines in the first region; and
   air gaps disposed beneath the first insulating material between the plurality of conductive lines in the second region.

2. The semiconductor device according to claim 1, wherein the plurality of conductive lines comprises widely-spaced conductive lines in the first region of the workpiece and closely-spaced conductive lines in the second region of the workpiece, or wherein the plurality of conductive lines comprises closely-spaced conductive lines in the first region of the workpiece and widely-spaced conductive lines in the second region of the workpiece.

3. The semiconductor device according to claim 1, further comprising a first cap layer disposed over the first insulating material and the plurality of conductive lines, the first cap layer comprising an insulating material.

4. The semiconductor device according to claim 3, further comprising a second cap layer disposed over the plurality of conductive lines beneath the first cap layer, the second cap layer comprising a conductive material.

5. The semiconductor device according to claim 1, wherein a thickness of the first insulating material comprises 34-25% of a thickness of the conductive lines and a thickness of the second insulating material comprises 66-75% of the thickness of the conductive lines.

6. The semiconductor device according to claim 1, wherein the first insulating material comprises a material with a decombustion temperature that is lower than a decombustion temperature of the second insulating material.

7. The semiconductor device according to claim 1 further comprising a barrier layer over sidewalls of the plurality of conductive lines.

8. A semiconductor device, comprising:
a plurality of conductive lines formed over a workpiece, the workpiece having a first region and a second region, the plurality of conductive lines having a top region;
a first insulating material comprising two components wherein one component is thermally labile, the first insulating material disposed between the plurality of conductive lines and proximate the top region, the first insulating material being impermeable in the first region and permeable in the second region;
a second insulating material in the first region, the second insulating material comprising polynorbornene disposed beneath the first insulating material, wherein a decombustion temperature of the thermally labile component is lower than a decombustion temperature of the second insulating material; and
air gaps disposed beneath the first insulating material between the plurality of first conductive lines in the second region.

9. The semiconductor device according to claim 8, wherein a first cap layer is formed over the top region of the conductive lines.

10. The semiconductor device according to claim 9, wherein a second cap layer is formed over the first cap layer and the first insulating material.

11. A semiconductor device, comprising:
a plurality of conductive lines formed over a workpiece, the workpiece having a first region and a second region, the plurality of first conductive lines having a top region;
a first insulating material comprising siloxane-organic co-polymere with about 10-20% Si content, the first insulating material being impermeable in the first region and permeable in the second region;
a second insulating material in the first region, the second insulating material comprising polynorbornene disposed beneath the first insulating material; and
air gaps disposed beneath the first insulating material between the plurality of first conductive lines in the second region.

12. The semiconductor device according to claim 11, wherein a first cap layer is formed over the top region of the conductive lines.

13. The semiconductor device according to claim 12, wherein a second cap layer is formed over the first cap layer and the first insulating material.

14. The semiconductor device according to claim 1, wherein the first insulating material comprises a spin-on glass and the second insulating material comprises non-photosensitive fine chemicals.

15. The semiconductor device according to claim 1, wherein the first insulating material comprises a spin-on glass and the second insulating material comprises polynorbornene.

16. The semiconductor device according to claim 1, wherein the first insulating material comprises a low-k material with a sacrificial component having a high porogen content and the second insulating material comprises polynorbornene.

17. The semiconductor device according to claim 1, wherein the first insulating material comprises a siloxane-organic co-polymer of about 10-20% Si and the second insulating material comprises non-photosensitive fine chemicals.

18. The semiconductor device according to claim 1, wherein the first insulating material comprises a siloxane-organic co-polymer of about 10-20% Si and the second insulating material comprises polynorbornene.

19. The semiconductor device according to claim 3, wherein the first cap layer is selected from the group of SiCN, SiN and an oxide.

20. The semiconductor device according to claim 4, wherein the second cap layer is selected from the group consisting of CoW, CoWP and TaN.

* * * * *